US012579351B2

(12) United States Patent
Bousquet et al.

(10) Patent No.: US 12,579,351 B2
(45) Date of Patent: Mar. 17, 2026

(54) PROGRAMMATICALLY GENERATED REDUCED FAULT INJECTIONS FOR FUNCTIONAL SAFETY CIRCUITS

(71) Applicant: Intel Corporation, Santa Clara, CA (US)

(72) Inventors: Richard Bousquet, Chandler, AZ (US); Anandh Krishnan, Fremont, CA (US); Vyasa Sai, Folsom, CA (US); Andrea Kroll, Plesanton, CA (US); Mauro Pipponzi, Agrate Brianza (IT)

(73) Assignee: Intel Corporation, Santa Clara, CA (US)

( * ) Notice: Subject to any disclaimer, the term of this patent is extended or adjusted under 35 U.S.C. 154(b) by 721 days.

(21) Appl. No.: 17/999,576

(22) PCT Filed: Jun. 25, 2020

(86) PCT No.: PCT/IT2020/000050
§ 371 (c)(1),
(2) Date: Nov. 22, 2022

(87) PCT Pub. No.: WO2021/260744
PCT Pub. Date: Dec. 30, 2021

(65) Prior Publication Data
US 2023/0222276 A1 Jul. 13, 2023

(51) Int. Cl.
*G06F 30/3308* (2020.01)
*G06F 30/3323* (2020.01)

(52) U.S. Cl.
CPC ...... *G06F 30/3308* (2020.01); *G06F 30/3323* (2020.01)

(58) Field of Classification Search
USPC ......................................................... 716/106
See application file for complete search history.

(56) References Cited

U.S. PATENT DOCUMENTS

| 6,577,992 B1 | 6/2003 | Tcherniaev et al. |
| 6,865,525 B1 | 3/2005 | Zhong |
| | | (Continued) |

FOREIGN PATENT DOCUMENTS

| CN | 102508981 B | 6/2014 |

OTHER PUBLICATIONS

Mirzaei Mohammad et al. "A New Approach 1-21 for Automatic Test Pattern Generation in Register Transfer Level Circuits", IEEE Design&Test, 11 pgs., vol. 30, No. 4, Aug. 1, 2013.
(Continued)

*Primary Examiner* — Bryce M Aisaka
(74) *Attorney, Agent, or Firm* — Banner & Witcoff, Ltd.

(57) ABSTRACT

Techniques are disclosed for eliminating redundancy in fault simulations to improve efficiency and to reduce the time and computing power required to generate a robust fault list, which results in adequate diagnostic coverage of a particular post-silicon electronic device for functional safety applications. The techniques described herein implement an automated methodology to identify identical sub-circuits in a design after the design is synthesized to gates, and utilize isomorphism to define a manner in which identical blocks may be reliably identified to ensure adequate coverage and accurate, consistent fault injection results. The netlist may advantageously implement a "flat" as opposed to a hierarchal design. Moreover, multiple levels of granularity may be identified for the various sub-circuits associated with the reference graphs used to identify isomorphic sub-graphs.

21 Claims, 3 Drawing Sheets

200

Netlist translated to graph dataset

Perform preprocessing on graph dataset to identify and eliminate obvious non-isomorphic sub-graphs, thereby generating reference sub-graphs — 202

Locate the reference sub-graphs within the netlist — 204

Decompose netlist into smaller partitions and identify isomorphic matches to the reference sub-graphs — 206

Identify and remove the fault location of recurring sub-circuits in the netlist identified from isomorphic graph matching — 208

Generate reduced/optimized fault list

(56)      References Cited

U.S. PATENT DOCUMENTS

| | | | |
|---|---|---|---|
| 7,415,403 | B2 | 8/2008 | McGaughy |
| 7,441,215 | B1 | 10/2008 | Sahrling |
| 10,852,354 | B1 * | 12/2020 | Chang ................. G06F 30/3308 |
| 2006/0161413 | A1 | 7/2006 | Wei et al. |
| 2020/0125779 | A1 * | 4/2020 | Kim ...................... G06F 30/327 |

OTHER PUBLICATIONS

Nadjarbashi Mehran et al. "Line Oriented Structural Equivalence Fault Collapsing", Jan. 1, 2000, 4 pgs., retrieved from the Internet: URL:https://www.eecg.utoronto.ca/-ece1767/ project/paper.pdf.
Benso et al. "Fault-List Collapsing for Fault-Injection Experiments", Reliability and Maintainability Symposium, 1998 Proceedings, Annual Anaheim, CA, USA, 6 pgs., Jan. 19, 1998.
Mar. 18, 2021 (PCT) International Search Report—App PCT/IT2020/000050.
Koranek, Daniel F. "Deterministic, Efficient Variation of Circuit Components to Improve Resistance to Reverse Engineering." (2012).

* cited by examiner

200

PROGRAMMATICALLY GENERATED REDUCED FAULT INJECTIONS FOR FUNCTIONAL SAFETY CIRCUITS

TECHNICAL FIELD

This disclosure generally relates to techniques for creating a fault injection list and, more particularly, to techniques that reduce the required fault list needed to provide adequate circuit diagnostic coverage using sub-graph isomorphism.

BACKGROUND

Fault injection is a testing technique which aids in understanding how a system behaves when faults occur in various ways, and may be particularly important for circuits or systems that require a high level of reliability to ensure safety requirements are met. Fault injection is typically performed by running a simulation of a particular electronic device for which the fault list was generated while monitoring the hardware and software fault detection mechanisms for fault detection. The simulation may include examples such as an integrated circuit, a logic chip, a processing chip such as a CPU, a graphics processor, a system on chip (SoC), etc. These fault-injection based simulations are performed during the pre-silicon design stages of the electronic device and used to determine what is referred to as a fault list, which is in turn used as a basis to generate software test libraries (STLs).

The STLs enable the electronic device, once fabricated (i.e. post silicon) to perform fault detection, which ensures that the various gates and/or interconnections are working properly as the electronic device operates over time, especially in more critical or safety-related applications such as autonomous vehicles, medical devices, etc. The fault injection may be applied on a netlist model, which is required in certain situations by ISO26262 to validate the relevant metrics (single point fault metrics (SPFm), latent fault metrics (LFm), etc.) after the introduction of the relevant safety mechanisms that implement the electronic device. However, for current simulations, running through the fault list requires a great deal of time, and current solutions to reduce this time may result in inadequate diagnostic coverage of the electronic device to be tested.

BRIEF DESCRIPTION OF THE FIGURES

The accompanying drawings, which are incorporated herein and form a part of the specification, illustrate the aspects of the present disclosure and, together with the description, and further serve to explain the principles of the aspects and to enable a person skilled in the pertinent art to make and use the aspects.

The exemplary aspects of the present disclosure will be described with reference to the accompanying drawings. The drawing in which an element first appears is typically indicated by the leftmost digit(s) in the corresponding reference number.

DETAILED DESCRIPTION

Figure 1:
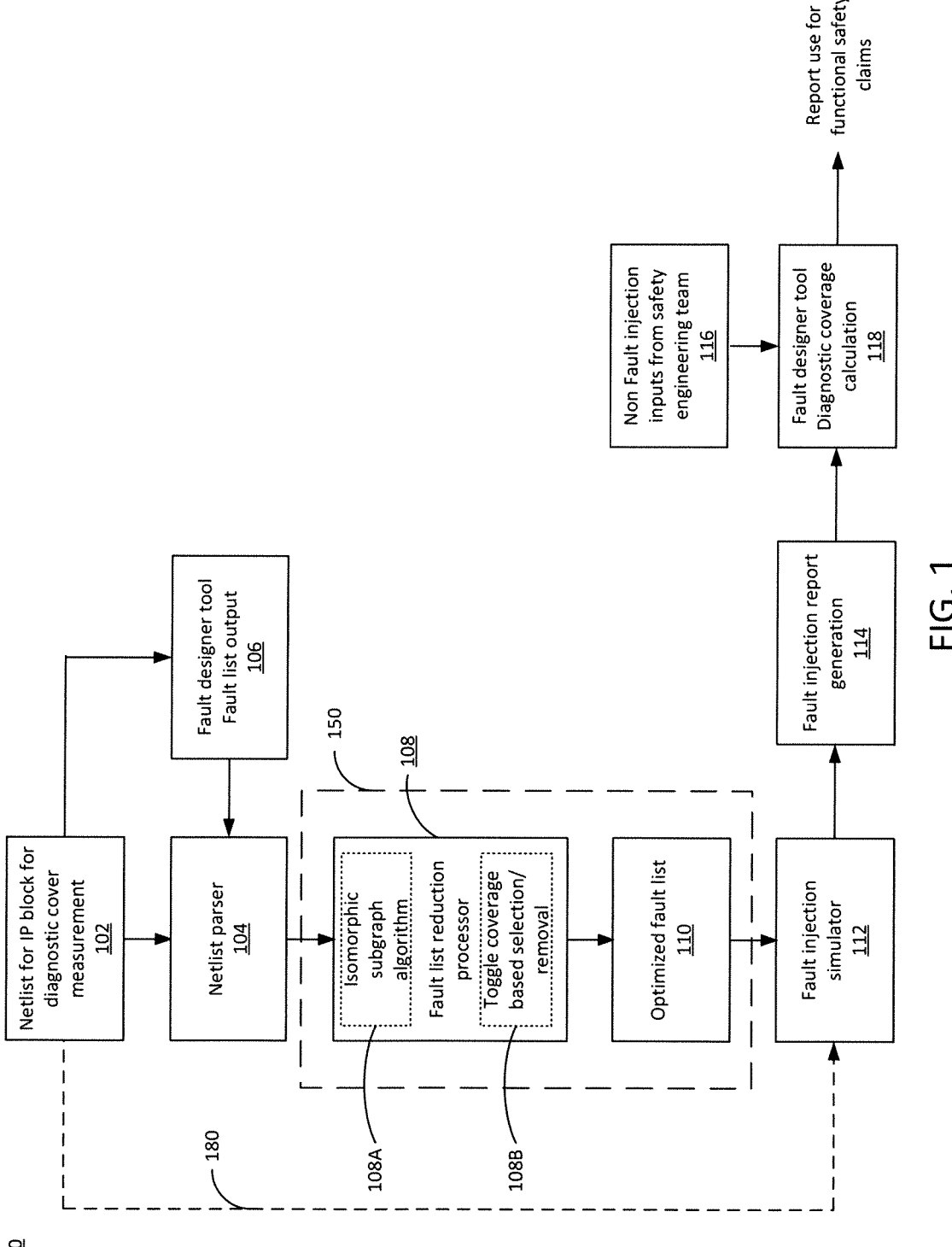
FIG. 1 illustrates an example block flow diagram showing the reduced fault injection process, in accordance with various aspects of the present disclosure.

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

As noted above, conventional fault injection campaigns require a great deal of time and computing power to execute. For instance, given the enormity of modern silicon designs, it can take months to run a fault simulation on only a part of a design using thousands of CPUs. Fault simulation requires each single fault to be injected into the logic gates of a design and a test to then be performed, which can take several hours to be run with the simulated fault, to determine if the safety mechanism detected it. Thus, the aspects as described herein address two primary issues related to the creation of fault injection lists and their subsequent use in a post-silicon design. These include the reduction of the size of the fault list and maintaining the accuracy of the measured safety metrics that, in turn, reduce the time and computing power required to determine the diagnostic coverage of the safety mechanisms in a design.

The aspects described herein focus on eliminating redundancy in fault simulations to improve efficiency and to reduce the time and computing power required to generate a robust fault list, which results in adequate diagnostic coverage for a particular post-silicon device. Finding identical sub-circuits at the block level in a design is relatively straightforward, as a designer typically instantiates a specific block/circuit multiple times within a single design. The technique of eliminating identical blocks from the fault injection list may be performed as part of a conventional simulation process, but it remains a manual approach and typically only works at a very coarse block level in the RTL (Pre-Synthesis design), as these are easily identified as duplicates. Further, current techniques leading to the identification of identical blocks and to the reduced fault list can only be performed on identical instances that are synthesized to gates in identical ways. For instance, current solutions for reducing the fault injection list consist of manually eliminating large blocks of the design that the designer knows are identical before the design is synthesized to logic gates. However, this is time consuming, and can lead to inaccuracies in the diagnostic coverage measurement, since these blocks may not be identical after the design is synthesized to logic gates, which is used to do the fault simulation. The aspects described herein can advantageously coexist with either this current approach or replace the current approach with an automated solution, depending on the selection of the cluster size for the sub-graphs, as further discussed below.

Alternatively, a designer may reduce the fault list size by taking a random sample of the original fault list, which is only a small percentage of the faults in the original fault list, and use this for the fault injection. In this technique, the fact that fault injection is not on the entire fault list reduces the confidence level on the measured metrics. No techniques currently exist for relating the percentage of faults actually injected to the confidence level of the results. Further complicating this issue, currently there are no existing automated techniques to check whether identical blocks are eliminated or to determine the acceptable criteria of what is to be considered "identical" blocks, which leads to inaccuracies in the fault injection results.

Thus, in summary, existing techniques are non-optimal, time consuming, inaccurate, require brute force, and are computationally intensive. Additionally, these are manual processes that are limited as there are no additional optimization techniques currently being used to efficiently analyze an entire design to find duplications and verify whether the key aspects of the criteria are met.

The aspects described herein address these issues by implementing an automated methodology to identify identical sub-circuits in a design after the design is synthesized to gates, and implement isomorphism to define a manner in which identical blocks may be accurately and reliably identified to ensure adequate diagnostic coverage and accurate, consistent fault injection results. To do so, the aspects as described herein implement sub-graph isomorphism and toggle coverage equivalence, which can be used to programmatically parse the gate level design, identify duplicate (logically equivalent and functionally equivalent) blocks, and produce a "uniquified" list of blocks on which to perform fault injection. This entire post-synthesis design can be parsed, and the reduced list will thus save computing resources, be algorithmically checked to assure the criteria is met for identifying design blocks for which fault injection may be eliminated, and the fault injection results applied from one copy of the design block to all of the duplicates. This advantageously provides an optimized automated methodology that significantly reduces the fault injection effort, especially in terms of computing time and power while maintaining the accuracy of the diagnostic coverage results.

FIG. 1 illustrates an example block flow diagram showing the reduced fault injection process, in accordance with various aspects of the present disclosure. Again, it is generally known that datapath circuits in particular have a large number of recurring sub-circuits. In the context of a fault injection campaign, the key idea is to leverage the recurring sub-circuit patterns in the given circuit for the purpose of fault injection acceleration. The main task is to extract the recurring sub-circuits in the given circuit and to ensure the fault injection is only applied to non-recurring sub-circuits, thus eliminating the need for injections on the recurring ones. To this end, FIG. 1 represents a high level flow of the fault injection process. The embodiments described herein are primarily directed to the flow associated with the block 150, which includes the processing tasks performed via the fault list reduction processor block 108 and the optimized fault list (netlist) block 110 in accordance with the various processing techniques as discussed herein.

The example flow diagram 100 as shown in FIG. 1 may represent a number of functions associated with respective blocks. The functionality associated with each of these blocks may be executed via any suitable number or type of processors, accompanying processor components, any suitable type of hardware components, software executed on the hardware components or via separate components, or combinations of any of these. These components may be identified with different hardware components or the same hardware components, in various aspects. For instance, the overall flow 100 may be executed as part of a system that includes one or more servers in communication with one or more client devices. The connection between the server(s) and client(s) may be implemented in accordance with any suitable number and/or type of network connections and using any suitable type of communication protocols. Such network connections may be implemented as part of an internal network (e.g. a local area network (LAN)), the Internet (e.g., to facilitate cloud-computing implementations), or combinations of these. The server(s) and client(s), as well as the connections between these components, are not shown in FIG. 1 for purposes of brevity, but may include any suitable number and/or type of such components to facilitate the aspects as described herein.

For example, a user may obtain a netlist for an intellectual property (IP) block for a specific diagnostic cover measurement in block 102. This may include the use of a workstation computer in communication with a server that is running a fault designer utility as is generally known. The netlist obtained in block 102 may thus represent the overall, un-optimized netlist for a particular circuit design, which may represent the entirety of an overall design such as a SoC, NoC, IC, etc. Thus, the dashed path 180 as shown in FIG. 1 represents a conventional usage of the fault injection simulator 112 in accordance with this original, un-optimized netlist. Continuing this example, the fault list injection simulator block 112 may, for instance, be executed on a server computer and execute a fault injection simulation in accordance with the diagnostic coverage represented by the (un-optimized) netlist created by the diagnostic cover measurement block 102.

However, as noted above, this un-optimized netlist may be quite large and include various redundant blocks, causing the fault injection simulator block 112 a great deal of time to identify each of the faults in the generated fault injection report, as represented by the fault injection report block 114. In any event, once the fault injection report is generated at block 114, it may be used by the fault designer tool to perform a diagnostic coverage calculation at block 118. The fault designer tool at block 118 may be implemented using any suitable techniques to determine the diagnostic coverage calculation using the fault injection report. In other words, the fault injection report block 114 is used to generate a report regarding the use of functional safety claims simulated by the fault injection simulator block 112. Continuing this example, the fault designer tool may be executed so as to exclude specific non fault injection inputs identified in block 116, which may be specified by an engineering team for instance. In this way, the fault designer tool at block 118 may utilize the fault injection report generated via the block 114, excepting for the identified non-fault injection inputs specified in block 116. Thus, the path 180 and the subsequent use of the fault injection simulator block 112, the fault injection report generation 114b, the fault designer tool 118, and the non-fault injection inputs in block 116 may represent a fault injection test procedure that is implemented in accordance with known techniques.

However, additionally or alternatively, the flow 100 may follow the path through the fault list reduction processor block 108, and this pathway is described further below in accordance with the various aspects of the present disclosure. In accordance with the various aspects further discussed herein, the fault list reduction processor is configured to programmatically detect and eliminate the unnecessary fault injection on replicated parts of a design, which is described in greater detail below with respect to FIG. 2. The aspects described herein assume that toggle coverage (activity pattern) is executed on a netlist under test (received via the netlist parser) to determine the fault activation. To do so, the aspects described herein utilize a toggle coverage based selection/removal algorithm 108B, which may be executed by the fault list reduction processor block 108 as further discussed below.

To generate a reduced fault list, aspects include the fault designer tool block 106 being configured to receive the un-optimized netlist as discussed above via the block 102. Again, this un-optimized netlist is a representation of a pre-silicon design. The un-optimized netlist is then processed via the netlist parser 104 to translate the netlist into a graph format to be processed by the fault list reduction processor block 108 as further discussed below. In other words, the netlist parser block 104 may receive a netlist and perform a data transformation of the netlist to a dataset that represents the netlist in a graph format. This process may be performed in accordance with any suitable techniques such that the resulting graph dataset is then processed by the various algorithms executed by the fault list reduction processor 108. Thus, the netlist parser functions to translate the un-optimized netlist for a pre-silicon design into a graph that represents the circuit associated with the netlist, whereas portions of the circuit are referred to herein as sub-circuits, which likewise may be represented as sub-graphs of the overall graph representations.

Turning now to the operation of the fault list reduction processor block 108, it is generally known that, even at multiple levels of granularity, identical (isomorphic) sub-circuits exist. The issue remains as to how these sub-circuits may be efficiently and accurately identified (i.e. "extracted") so that the faults of the identical sub-circuits may be removed from the fault list as each identical sub-circuit need not be tested. The aspects described herein facilitate the fault list reduction processor block 108 automatically identifying isomorphic sub-circuits in a design after the design has been synthesized to gates and translated into a graph dataset, which is represented by the data output by the netlist parser block 104, for instance. The fault injection points can thus be guaranteed to be identical as the search methodology for duplicates is applied after the synthesis process. To do so, a limited set of gates in a silicon technology library is identified as a subgraph with a high probability to find isomorphic sub-circuits in designs. For the purposes of this disclosure, this is referred to as a "reference" graph (or sub-graph). By applying isomorphic algorithms using reference graphs, the fault-list size may be reduced in a dependable way, which increases the accuracy of the diagnostic coverage measurement while reducing the fault simulation time and resource requirements. As a proof of concept, this approach was applied to a network-on-chip (NoC) interconnect IP that resulted in identifying close to 95% of the netlist as being commonly recurring sub-circuits such as duplicated routers, switches, and bridges.

The aspects described herein facilitate the fault list reduction processor block 108 addressing what is known as the "sub-circuit extraction problem," to efficiently and accurately identify duplicate portions of a design netlist. Doing so enables a reduction in the fault list by eliminating redundant portions of the circuit design that need not be tested. The aspects described herein advantageously recognize that, because electronic circuits may be represented as graphical structures, the sub circuit extraction problem is analogous to that of sub-graph isomorphism.

To this end, a brief discussion regarding isomorphism in this context is warranted. For instance, a given graph G1 is isomorphic to a sub-graph H of another given graph G2 if there exists a one-to-one mapping of the nodes of G1 onto the nodes of H, such that all corresponding edge adjacencies are preserved. The practical issue, however, is identifying an efficient algorithm or approach for determining whether one given graph (e.g. a smaller graph, G1) is an isomorphic sub-graph of another graph (e.g. a larger graph, G2). Similarly, the problem of sub circuit extraction can be defined as determining whether one given smaller (guest) circuit G1 is isomorphic to a sub-circuit H of another given larger (host) circuit G2. A variant of the sub circuit extraction problem is that of determining commonly-occurring sub-circuits (e.g. sub structures) of a given circuit. In summary, the aspects described herein utilize an isomorphic sub-graph algorithm represented by the block 108A, which may be executed by the fault list reduction processor block 108 to provide an efficient approach to finding duplicate sub-circuits in a design, leading to optimized fault-list size for fault injections.

Figure 2:
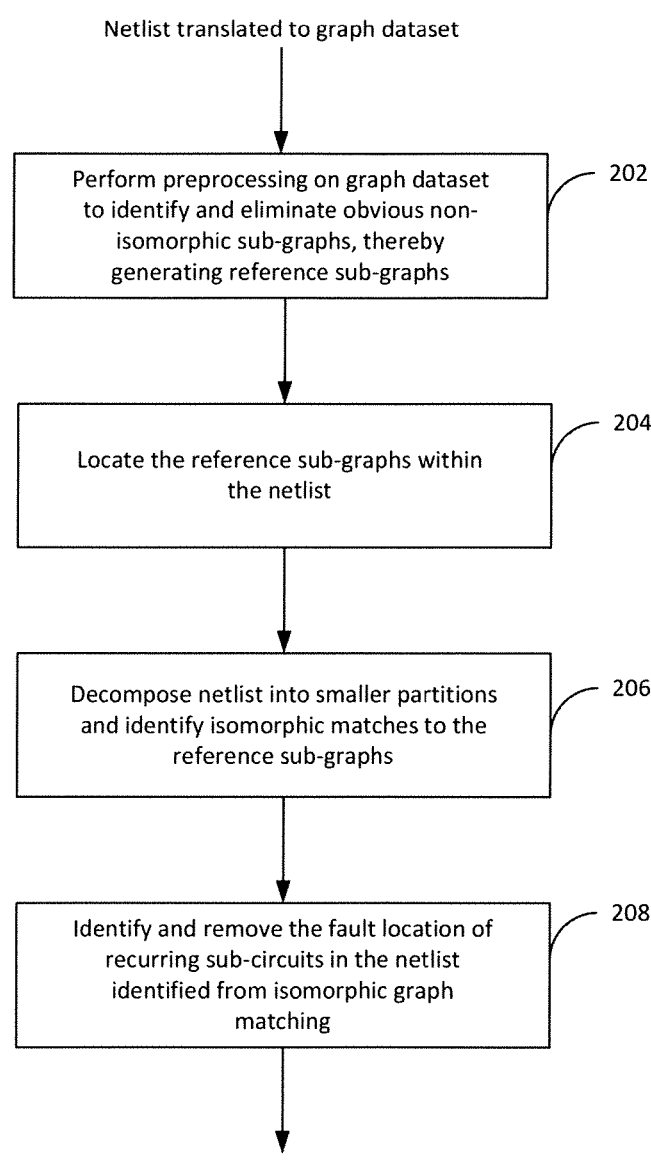
FIG. 2 illustrates an example block flow diagram showing the sub-circuit extraction flow, in accordance with various aspects of the present disclosure.

FIG. 2 illustrates an example block flow diagram showing a sub-circuit extraction flow, in accordance with various aspects of the present disclosure. The flow 200 as shown and further described below with reference to FIG. 2 may be identified with the functionality performed via the fault list reduction processor block 108, for example, as shown in FIG. 1. Thus, the following terminology is provided with respect to the operation of the fault list reduction processor block 108.

An Edge Unit (EU) is an edge associated with its two terminal nodes.

The distance d(n1, n2) of two nodes n1 and n2 is the length of a shortest path (i.e. the number of edges in the shortest path) between them. The distance d(n1, n2) of two nodes with a common EU is 1.

The eccentricity E(n) of a node n is the distance from n to the nodes farthest from n in G as defined by Equation 1 below as follows:

$$E(n) = \max \ d(n,ni), ni \in G \qquad \text{Eqn. 1:}$$

The center of G is a node with minimum eccentricity in G.

The radius of the graph is the eccentricity of a center, which is the distance from the center of the graph to the farthest node of the graph.

A path is a finite alternating sequence of nodes and edges, beginning and ending with nodes. No edge or node appears more than once, such that each edge is incident with the nodes preceding and following it.

At a high level, the approach involves traversing the input design netlist received via the netlist parser block 104 represented as a graph dataset, and identifying clusters of logic in the graph dataset that have identical topology and connectivity. Advantageously, the aspects described herein facilitate a top-down approach, exploit the design hierarchy, sub-divide a given graph into successively finer grained sub-graphs, identify identical sub-structures, and extract the recurring sub-circuits from an overall design to provide an optimized fault list as shown in the block 110. This optimized fault list may then be used for the input to the fault injection simulator block 112 as shown in FIG. 1 instead of the un-optimized netlist provided via the path 180 as discussed above.

The flow 200 as shown in FIG. 2 may correspond to the execution of the isomorphic sub-graph algorithm 108A via the fault list reduction processor bock 108, as shown in FIG. 1. To do so, aspects include the flow 200 comprising 4 stages to facilitate the sub-circuit extraction using the graph dataset received via the netlist parser block 104. These stages include preprocessing, locating, decomposing, and labelling, as further discussed below. The first of these stages is the preprocessing stage 202, which operates on an input as shown in FIG. 2. This input may represent, for instance, the graph dataset that represents a translated gate level netlist of the design on which the sub-circuit extraction is to be applied (e.g. the output of the netlist parser 104). Once the preprocessing is complete, the recurring sub-circuits in the design under test that have multiple instances in the design may be identified. The list of recurring sub-circuits and their respective locations constitutes the output of the labeling stage 208 as shown in FIG. 2.

The flow 200 includes a preprocessing stage 202 that operates on the graph dataset representing an input gate level netlist as discussed above. The preprocessing stage 202 functions to eliminate instances of "obvious" non-isomorphic sub-graphs. Advantageously, the netlist that is translated to the graph dataset via the netlist parser 104 may have a flat (e.g. only primitives are instanced) or a hierarchal design. For example, as is generally known, the paths to each primitive in a netlist, taken together, may comprise a large but flat netlist that is equivalent to a compact hierarchical version of the netlist. The aspects disclosed herein are described using an assumed flat netlist design by way of example and not limitation. It may be particularly advantageous to implement a netlist having a flat design as opposed to the use of netlist having a pre-defined hierarchy. In such a case and as further discussed below, the preprocessing stage 202 functions to identify a set of sub-circuits in a flat netlist design, which are then used as a "base line" for pattern matching using isomorphic graphs. The base line sub-graphs can also advantageously be at different granularities with respect to one another. Then, as further discussed below, the base line sub-graphs are used to find a pattern match with the other sub-circuits using isomorphic graphs.

In an aspect, the preprocessing stage 202 may function in a heuristic manner, using an initial fault injection list as starting points that identify portions within the netlist that are to be tested. As part of the sub-circuit extraction process, this initial fault list may then be reduced by removing the identified duplicate sub-circuits, as discussed herein. The fault list may represent an overall fault list for which the netlist is to be tested, or a portion thereof (e.g. a statistically significant sample size). The portion of the fault list that is used in the preprocessing step may be varied in accordance with the available processing resources, and considering tradeoffs such as time versus the desired level of reduction in the fault list, in various aspects. In other words, the preprocessing stage 202 receives a graph dataset corresponding to a graph representation of a netlist of a circuit design for which fault injection simulation is to be performed in accordance with an initial fault list, the graph including a set of sub-graphs associated with respective sub-circuits of the circuit design.

The preprocessing stage 202 includes using the graph dataset to identify eccentricity to other portions (sub-circuits) in the overall netlist design. Aspects include the preprocessing stage functioning to calculate, from among the graph represented by the graph dataset, a set of reference sub-graphs that have a greater likelihood of being isomorphic. In other words, the set of reference sub-graphs may be considered candidates from those in the graph for being isomorphic with other sub-graphs in the netlist. To do so, aspects include computing the node eccentricities of a given number of sub-graph pairs within the graph dataset. Isomorphism may exist between a portion of sub-circuits, which may be represented as sub-graphs of the overall parsed graph dataset. A one-to-one comparison may be made of any suitable number of the sub-graphs to filter out obvious non-isomorphic sub-graphs. In various aspects, different pairs of sub-graphs in the overall graph dataset may be compared to one another to make this determination.

For instance, every combination of the sub-graphs of the overall parsed graph dataset as identified in the initial fault list may be compared to one another, or a smaller subset thereof. In any event, each sub-graph comparison may be executed by computing the node eccentricities of two sub-graphs and storing the computed node eccentricities into two arrays, which are represented in this example as array X and array Y. The X and Y arrays are then sorted and compared with one another, with a mismatch between the X and Y arrays indicating that the sub-graphs are non-isomorphic with one another. A match, however, indicates that the sub-graphs may potentially be isomorphic with one another pending the satisfaction of additional criteria, as discussed further below. In other words, these candidate matching sub-graphs have a higher likelihood of being isomorphic with one another, and thus are used for the next steps in the flow 200. These potential matching sub-graphs are referred to herein as reference sub-graphs. Again, these reference sub-graphs may be advantageously generated having a different granularity than one another.

The flow 200 includes a locating stage 204, which operates on the output of the preprocessing stage 202 (i.e. the reference sub-graphs). In an aspect, the locating stage 204 includes locating, from among the reference sub-graphs, their actual location within the graph. Location in this context means the location within the netlist that the graph represents. Thus, the locating stage 204 includes identifying the locations of all or a portion of the possible isomorphic sub-graphs in the netlist. Moreover, the basic nodes for decomposing in the subsequent stage 206 and the starting nodes for the subsequent labeling stage 208 are determined in this stage. In an aspect, the locating stage 204 builds a set of nodes that are starting points for the pattern matching engine, Vs, which is further discussed below in the decomposing stage 206 and the labeling stage 208.

The set of starting point nodes Vs may form part of the isomorphic sub-graph algorithm 108A that is executed via the fault list reduction processor block 108. These set of starting point nodes Vs may function in accordance with any suitable type of pattern matching algorithm and/or process to identify sub-graph isomorphism using the reference sub-graphs. The nodes in Vs thus serve as anchor points for the pattern matching process (i.e., the number of nodes may be predetermined or learned pattern matching parameters used in accordance with the pattern matching). The nodes in Vs may be obtained, for instance, using the sorted arrays X, Y calculated in the preprocessing stage 202 that resulted in the generation of the reference sub-graphs, and taking the top N nodes from the start element of the array in each case, in which N may be a predetermined number of nodes. In this context, N is a parameter obtained by empirically tuning the isomorphic sub-graph algorithm 108A. This empirical tuning may be provided, for instance, via experimental data or by comparting the results of various simulations over time.

In an aspect, the decomposing stage 206 includes "slicing" or partitioning the netlist into smaller portions, which may be performed independent of the locating performed in step 204 as discussed above. To do so, aspects include randomly selecting sub-graphs from among the graph dataset having the same size as the reference sub-graphs found in the locating step. In other words, the decomposing stage 206 functions to select circuits from among the overall netlist (i.e. selected from among the graph dataset) that are to be matched in the labeling stage 208. This is done because not all reference sub-graphs are the same size as one another, so the decomposing stage 206 finds, for each of the reference sub-graphs, candidates to match (isomorphically) to each of them having a similar or identical size by dividing the overall netlist (graph dataset) into smaller sub-circuits (sub-graphs). In other words, the decomposing stage 206 functions to partition the netlist into a decomposed netlist by selecting a subset of the set of sub-graphs having a size that matches one or more of the reference sub-graphs.

In an aspect, the decomposing stage 206 obtains partitions of sub-graphs from the graph dataset (represented as G) by dividing the set of starting point nodes Vs (i.e. the input to the pattern matching engine as discussed herein) into disjoint sets, such that the center of the nodes in each set are roughly (e.g. within a tolerance such as 1%, 5%, 10%, etc.) of the same distance from the center of the graph G. Thus, the decomposing stage 206 includes dividing a given graph G into a series of sub-graphs, each containing a similar number of nodes. In this way, the reference sub-graphs identified in the preprocessing stage 202 are used to identify the isomorphic sub-graphs in the decomposed netlist performed in the decomposing stage 206. In other words, one or more sub-graphs may be identified within the decomposed netlist that are isomorphic with one or more of the reference sub-graphs. Searching the sub-graphs for isomorphic graphs reduces the complexity in the next labeling stage 208. In this way, one or more isomorphic sub-graphs within the decomposed netlist are identified that are isomorphic with one or more of the reference sub-graphs.

In an aspect, the labeling stage 208 uses, as a starting point, data associated with the starting point nodes or anchor points identified in the locating stage 204 as discussed above. The labeling stage 208 thus includes assigning a deterministic label to each vertex in the sub-graph based on the label assigned to its predecessor nodes. Thus, a path in the sub-graph corresponds to a sequence of labels. Using this sequence of labels as a signature, recurring sub-circuits may be identified by matching strings computed in the labeling stage 208. In this way, the labeling stage 208 functions to determine, from the processing performed in the decomposing stage 206, recurring sub-circuits in the (un-optimized) netlist based upon the location of the isomorphic sub-graphs.

In an aspect, the flow 200 may include applying constraints to bound the size of the sub-graphs before the algorithm is run for the optimal sub-graph (sub-circuit) size range. These constraints, as well as the selection of the number of nodes combined in the sub-graphs, define the granularity of the sub-circuits for pattern matching. These constraints may be defined, for instance, as part of the functionality of the netlist parser block 104. Depending on the particular design, however, there may be multiple levels of granularity that result in the identification of isomorphic sub-graphs. Thus, the above described flow 200 may be executed in an iterative manner using several combinations of constraints and a number of nodes, which are provided by the output of the netlist parser block 104. The output of this approach, as shown in FIG. 2 as the output of the labeling stage 208, represents the set of recurring sub-circuits in a given netlist that may be used to generate the optimized fault list, which may be identified for example with the functionality associated with the optimized fault list (netlist) block 110 as shown in FIG. 1. That is, the labeling stage 208 may function to remove the identified location of each of the isomorphic sub-graphs in the netlist from the initial fault list to generate a reduced or optimized fault list. This may include, for example, removing the identified location of all but one of the isomorphic sub-graphs in the netlist from the initial fault list to generate the reduced fault list. Other examples include removing the location of a lesser amount of locations of isomorphic sub-graphs in the netlist to generate the reduced fault list.

This list can optionally be further fine-tuned using the initially obtained toggle coverage from the netlist by using similar activity patterns as a criteria for a second pass. This functionality may be performed, for instance, via the toggle coverage based selection/removal algorithm 108B as shown in FIG. 1, which may be executed by the fault list reduction processor block 108. For instance, during the first iteration or pass, the duplicate sub-graphs, which have identical toggle coverage, are targeted for elimination by the isomorphic sub-graph algorithm 108A, and then may be removed from the fault list using the toggle coverage associated with the selection/removal algorithm 108B as an additional criteria.

In other words, toggle coverage is used to check a list of duplicates to increase confidence using the activity pattern in the second pass. The resulting optimized fault list is then output by the optimized fault list block 110, which is provided to the fault injection simulator block 112 as shown in FIG. 1. The fault injection simulator block 112 may use the optimized fault list to inject faults that has the locations in the netlist associated with redundant sub-circuits removed, as opposed to the conventionally obtained fault list which would include all fault list locations and thus be much larger (e.g. via the path 180), thereby reducing the overall computing time and power for an accelerated fault injection process.

To summarize, the aspects described herein enable the identification of the logically and functionally equivalent logic graphs using sub-graph isomorphism for finding identical sub-graphs of different sizes throughout all levels of hierarchy and toggle coverage for functional equivalence, respectively. The notable measures applied is to obtain a list of equivalent sub-graphs from the isomorphic algorithm, and further filtering out the sub-graphs that have identical toggle coverage. The automation uniqueness executes the above measures to programmatically enable the diagnostic coverage measurement of the algorithmically-reduced uniquified list of sub-graphs, and applies that measurement across the duplicate sub-graphs which have been eliminated from the fault injection process.

Figure 3:
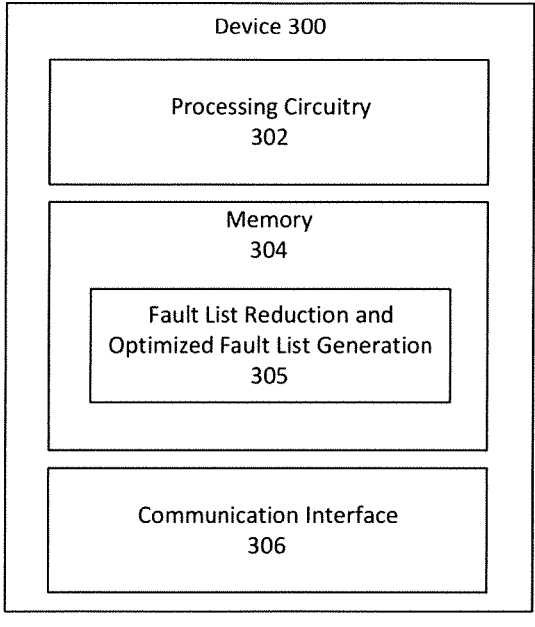
FIG. 3 illustrates an example device, in accordance with various aspects of the present disclosure.

FIG. 3 illustrates an example device, in accordance with various aspects of the present disclosure. In various aspects, the device 300 may be implemented as any suitable type of device configured to communicate with and/or control various components of a network architecture, such as the various components as shown and described herein with reference to FIG. 1, for instance. The device 300 may thus be implemented in accordance with any suitable number and/or type of hardware and/or software components, and may operate in accordance with any suitable number and/or type of communication protocols. For instance, the device 300 may be implemented as a server computer or a client computer, or one or more portions thereof. The device 300 may implement one or more aspects as described herein to facilitate providing a reduced or optimized fault list for a particular circuit design netlist.

In an aspect, the device 300 may include processing circuitry 302, a memory 304, and a communication interface 306, which may be coupled to one or more wired and/or wireless connections that are not shown in FIG. 3 for purposes of brevity. The communication interface 306 may facilitate the receipt of data (e.g. a graph dataset via the netlist parser block 104) and the transmission of data (e.g.

the optimized fault list to the fault injection simulator block 112) in accordance with any suitable communication interface and/or protocol, and may occur within the same device (e.g. a server) or among different devices (e.g. a server and client device in communication with one another) as discussed herein with respect to FIG. 1. The components shown in FIG. 3 are provided for ease of explanation, and aspects include the device 300 including additional, less, or alternative components as those shown in FIG. 3. For example, the device 300 may include one or more power sources, display interfaces, peripheral devices, ports, etc. To provide additional examples, the device 300 may include additional communication interfaces, and may be configured to transmit and receive data wirelessly or via one or more wired connections in accordance with one or more of such communication interfaces, which are not shown in FIG. 3 for purposes of brevity.

In an aspect, the various components of the device 300 may be identified with functionality further described herein. To do so, processing circuitry 302 may be configured as any suitable number and/or type of computer processors, which may facilitate control of the device 300 as discussed herein. In some aspects, processing circuitry 302 may be identified with one or more portions of a server or client device as noted herein. Aspects include the processing circuitry 302 being configured to carry out instructions to perform arithmetical, logical, and/or input/output (I/O) operations, and/or to otherwise perform the aspects described herein and/or control the operation of one or more components of the device 300.

For example, the processing circuitry 302 can include one or more microprocessors, memory registers, buffers, clocks, etc., and may include, implement, or control portions of the device 300, a network architecture, and/or components operating within a particular network architecture as discussed herein. Such communications and/or control may be realized, for instance, in conjunction with the communication interface 306. Moreover, aspects include processing circuitry 302 communicating with and/or controlling functions associated with the memory 304 and/or the communication interface 306.

In an aspect, the memory 304 stores data and/or instructions such that, when the instructions are executed by the processing circuitry 302, causes the processing circuitry 302 to perform the various functions described herein in accordance with the flows 100 and/or 200, for instance, as discussed herein with respect to FIGS. 1 and 2, respectively. The memory 304 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 304 can be non-removable, removable, or a combination of both.

For example, the memory 304 may be implemented as a non-transitory computer readable medium storing one or more executable instructions such as, for example, logic, algorithms, code, etc. The instructions, logic, code, etc., stored in the memory 304 is represented by the fault list reduction and optimized fault list generation module 305, and may include additional or alternate software components and/or instructions. The instructions stored in the fault list reduction and optimized fault list generation module 305 may enable the aspects disclosed herein to be functionally realized. Alternatively, if the aspects described herein are implemented via hardware, the fault list reduction and optimized fault list generation module 305 may include instructions and/or code to facilitate control, and/or monitor the operation of such hardware components.

In other words, the fault list reduction and optimized fault list generation module 305 is provided for ease of explanation regarding the functional association between hardware and software components. Thus, aspects include the processing circuitry 302 executing the instructions stored in the fault list reduction and optimized fault list generation module 305 in conjunction with one or more hardware and/or software components to perform the various functions associated with the aspects as further discussed herein. In an aspect, the fault list reduction and optimized fault list generation module 305 may store instructions that facilitates the execution of the isomorphic sub-graph algorithm 108A and/or the toggle coverage based selection/removal algorithm 108B, as shown and described herein with reference to FIG. 1, for example, via the processing circuitry 302. Additionally, the fault list reduction and optimized fault list generation module 305 may store instructions that facilitates the execution of the optimized fault list via the optimized fault list block 110, as shown and described herein with reference to FIG. 1, for example, via the processing circuitry 302. Thus, the processing circuitry 302 may be identified with the fault list reduction processor 108 in this example, and additionally may be identified with one or more other components executing the functions of the flow 100 as shown in FIG. 1.

In this way, the aspects described herein are directed to a methodology that formally proves isomorphic behavior as opposed to doing so with the use of a circuit simulation. Furthermore, the aspects described herein provide a reduction of fault insertion points with the same diagnostic coverage results by identifying and removing from the fault list targets of duplicative portions of sub-circuits in a netlist. The aspects described herein may advantageously utilize a "flat" netlist design and do not require the use of a predefined hierarchy to identify isomorphic sub-circuits. As described above, the first step is to identify a set of sub-circuits in that flat design, which are then used as a base line for pattern matching using isomorphic graphs. The base line sub-graphs described herein (e.g. the reference sub-graphs) may be generated having a different granularity that one another.

EXAMPLES

The following examples pertain to further aspects.

Example 1 is a device, comprising: a communication interface configured to receive a graph dataset corresponding to a graph representation of a netlist of a circuit design for which fault injection simulation is to be performed in accordance with an initial fault list, the graph including a set of sub-graphs associated with respective sub-circuits of the circuit design; and processor circuitry configured to: calculate, from the graph, a set of reference sub-graphs that are candidates for being isomorphic with other sub-graphs in the netlist; partition the netlist into a decomposed netlist by selecting a subset of the set of sub-graphs having a size that matches one or more of the reference sub-graphs; identify, as one or more isomorphic sub-graphs, one or more sub-graphs within the decomposed netlist that are isomorphic with one or more of the reference sub-graphs; identify a location of each of the isomorphic sub-graphs in the netlist; and remove the identified location of all but one of the isomorphic sub-graphs in the netlist from the initial fault list to generate a reduced fault list.

In Example 2, the subject matter of Example 1, wherein the one or more processors are configured to: calculate the set of reference sub-graphs by computing and storing, in a memory associated with the device, node eccentricities associated with a first sub-graph and a second sub-graph from among the sub-graphs in a first and a second array, respectively; and identify the first sub-graph and the second sub-graph as candidates for being isomorphic and thus belonging to the set of reference sub-graphs when an eccentricity of the first array and an eccentricity of the second array match one another.

In Example 3, the subject matter of one or more of Examples 1-2, wherein the one or more processors are configured to identify (i) the location of one or more sub-graphs in the netlist that are isomorphic to one of the set of reference sub-graphs by executing a pattern matching process that utilizes, as a pattern matching parameter, a predetermined number of nodes from a start element of the first array and the second array, respectively, and (ii) a location of recurring sub-circuits in the circuit design using matching strings computed as a result of the pattern matching process.

In Example 4, the subject matter of one or more of Examples 1-3, wherein the one or more processors are configured to partition the netlist into the decomposed netlist by randomly selecting the subset of the set of sub-graphs having a size that matches one or more of the reference sub-graphs.

In Example 5, the subject matter of one or more of Examples 1-4, wherein the one or more processors are configured to partition the netlist into the decomposed netlist such that the center of nodes of the subset of the set of sub-graphs are the same distance from a center of the graph.

In Example 6, the subject matter of one or more of Examples 1-5, wherein the netlist has a flat design in which only primitives are instanced.

In Example 7, the subject matter of one or more of Examples 1-6, wherein at least some of the one or more of the sub-circuits that are associated with the reference sub-graphs have a different netlist granularity.

Example 8 is a device, comprising: a memory configured to store computer-readable instructions; and one or more processors configured to execute the computer-readable instructions stored in the memory to: receive a graph dataset corresponding to a graph representation of a netlist of a circuit design for which fault injection simulation is to be performed in accordance with an initial fault list, the graph including a set of sub-graphs associated with respective sub-circuits of the circuit design; calculate, from the graph, a set of reference sub-graphs that are candidates for being isomorphic with other sub-graphs in the netlist; partition the netlist into a decomposed netlist by selecting a subset of the set of sub-graphs having a size that matches one or more of the reference sub-graphs; identify, as one or more isomorphic sub-graphs, one or more sub-graphs within the decomposed netlist that are isomorphic with one or more of the reference sub-graphs; identify a location of each of the isomorphic sub-graphs in the netlist; and remove the identified location of all but one of the isomorphic sub-graphs in the netlist from the initial fault list to generate a reduced fault list.

In Example 9, the subject matter of Example 8, wherein the one or more processors are configured to: calculate the set of reference sub-graphs by computing and storing, in the memory, node eccentricities associated with a first sub-graph and a second sub-graph from among the sub-graphs in a first and a second array, respectively; and identify the first sub-graph and the second sub-graph as candidates for being isomorphic and thus belonging to the set of reference sub-graphs when an eccentricity of the first array and an eccentricity of the second array match one another.

In Example 10, the subject matter of one or more of Examples 8-9, wherein the one or more processors are configured to identify (i) the location of one or more sub-graphs in the netlist that are isomorphic to one of the set of reference sub-graphs by executing a pattern matching process that utilizes, as a pattern matching parameter, a predetermined number of nodes from a start element of the first array and the second array, respectively, and (ii) a location of recurring sub-circuits in the circuit design using matching strings computed as a result of the pattern matching process.

In Example 11, the subject matter of one or more of Examples 8-10, wherein the one or more processors are configured to partition the netlist into the decomposed netlist by randomly selecting the subset of the set of sub-graphs having a size that matches one or more of the reference sub-graphs.

In Example 12, the subject matter of one or more of Examples 8-11, wherein the one or more processors are configured to partition the netlist into the decomposed netlist such that the center of nodes of the subset of the set of sub-graphs are the same distance from a center of the graph.

In Example 13, the subject matter of one or more of Examples 8-12, wherein the netlist has a flat design in which only primitives are instanced.

In Example 14, the subject matter of one or more of Examples 8-13, wherein at least some of the one or more of the sub-circuits that are associated with the reference sub-graphs have a different netlist granularity.

Example 15 is a non-transitory computer readable medium having instructions stored thereon that, when executed by one or more processors, cause the one or more processors to: receive a graph dataset corresponding to a graph representation of a netlist of a circuit design for which fault injection simulation is to be performed in accordance with an initial fault list, the graph including a set of sub-graphs associated with respective sub-circuits of the circuit design; calculate, from the graph, a set of reference sub-graphs that are candidates for being isomorphic with other sub-graphs in the netlist; partition the netlist into a decomposed netlist by selecting a subset of the set of sub-graphs having a size that matches one or more of the reference sub-graphs; identify, as one or more isomorphic sub-graphs, one or more sub-graphs within the decomposed netlist that are isomorphic with one or more of the reference sub-graphs; identify a location of each of the isomorphic sub-graphs in the netlist; and remove the identified location of all but one of the isomorphic sub-graphs in the netlist from the initial fault list to generate a reduced fault list.

In Example 16, the subject matter of Example 15, further including instructions that, when executed by the one or more processors, cause the one or more processors to: calculate the set of reference sub-graphs by computing node eccentricities associated with a first sub-graph and a second sub-graph from among the sub-graphs in a first array and a second array, respectively; and identify the first sub-graph and the second sub-graph as candidates for being isomorphic and thus belonging to the set of reference sub-graphs when an eccentricity of the first array and an eccentricity of the second array match one another.

In Example 17, the subject matter of one or more of Examples 15-16, further including instructions that, when executed by the one or more processors, cause the one or more processors to identify (i) the location of one or more sub-graphs in the netlist that are isomorphic to one of the set of reference sub-graphs by executing a pattern matching process that utilizes, as a pattern matching parameter, a predetermined number of nodes from a start element of the first array and the second array, respectively, and (ii) a location of recurring sub-circuits in the circuit design using matching strings computed as a result of the pattern matching process.

In Example 18, the subject matter of one or more of Examples 15-17, further including instructions that, when executed by the one or more processors, cause the one or more processors to partition the netlist into the decomposed netlist by randomly selecting the subset of the set of sub-graphs having a size that matches one or more of the reference sub-graphs.

In Example 19, the subject matter of one or more of Examples 15-18, further including instructions that, when executed by the one or more processors, cause the one or more processors to partition the netlist into the decomposed netlist such that the center of nodes of the subset of the set of sub-graphs are the same distance from a center of the graph.

In Example 20, the subject matter of one or more of Examples 15-19, wherein the netlist has a flat design in which only primitives are instanced.

In Example 21, the subject matter of one or more of Examples 15-20, wherein at least some of the one or more of the sub-circuits that are associated with the reference sub-graphs have a different netlist granularity.

Example 22 is a device, comprising: a communication means for receiving a graph dataset corresponding to a graph representation of a netlist of a circuit design for which fault injection simulation is to be performed in accordance with an initial fault list, the graph including a set of sub-graphs associated with respective sub-circuits of the circuit design; and processing means for: calculating, from the graph, a set of reference sub-graphs that are candidates for being isomorphic with other sub-graphs in the netlist; partitioning the netlist into a decomposed netlist by selecting a subset of the set of sub-graphs having a size that matches one or more of the reference sub-graphs; identifying, as one or more isomorphic sub-graphs, one or more sub-graphs within the decomposed netlist that are isomorphic with one or more of the reference sub-graphs; identifying a location of each of the isomorphic sub-graphs in the netlist; and removing the identified location of all but one of the isomorphic sub-graphs in the netlist from the initial fault list to generate a reduced fault list.

In Example 23, the subject matter of Example 22, wherein the processing means further: calculates the set of reference sub-graphs by computing and storing, in a memory associated with the device, node eccentricities associated with a first sub-graph and a second sub-graph from among the sub-graphs in a first and a second array, respectively; and identifies the first sub-graph and the second sub-graph as candidates for being isomorphic and thus belonging to the set of reference sub-graphs when an eccentricity of the first array and an eccentricity of the second array match one another.

In Example 24, the subject matter of one or more of Examples 22-23, wherein the processing means further identifies (i) the location of one or more sub-graphs in the netlist that are isomorphic to one of the set of reference sub-graphs by executing a pattern matching process that utilizes, as a pattern matching parameter, a predetermined number of nodes from a start element of the first array and the second array, respectively, and (ii) a location of recurring sub-circuits in the circuit design using matching strings computed as a result of the pattern matching process.

In Example 25, the subject matter of one or more of Examples 22-24, wherein the processing means partitions the netlist into the decomposed netlist by randomly selecting the subset of the set of sub-graphs having a size that matches one or more of the reference sub-graphs.

In Example 26, the subject matter of one or more of Examples 22-25, wherein the processing means partitions the netlist into the decomposed netlist such that the center of nodes of the subset of the set of sub-graphs are the same distance from a center of the graph.

In Example 27, the subject matter of one or more of Examples 22-26, wherein the netlist has a flat design in which only primitives are instanced.

In Example 28, the subject matter of one or more of Examples 22-27, wherein at least some of the one or more of the sub-circuits that are associated with the reference sub-graphs have a different netlist granularity.

Example 29 is a device, comprising: a memory configured to store computer-readable instructions; and processing means for executing the computer-readable instructions stored in the memory to: receive a graph dataset corresponding to a graph representation of a netlist of a circuit design for which fault injection simulation is to be performed in accordance with an initial fault list, the graph including a set of sub-graphs associated with respective sub-circuits of the circuit design; calculate, from the graph, a set of reference sub-graphs that are candidates for being isomorphic with other sub-graphs in the netlist; partition the netlist into a decomposed netlist by selecting a subset of the set of sub-graphs having a size that matches one or more of the reference sub-graphs; identify, as one or more isomorphic sub-graphs, one or more sub-graphs within the decomposed netlist that are isomorphic with one or more of the reference sub-graphs; identify a location of each of the isomorphic sub-graphs in the netlist; and remove the identified location of all but one of the isomorphic sub-graphs in the netlist from the initial fault list to generate a reduced fault list.

In Example 30, the subject matter of Example 29, wherein the processing means further: calculate the set of reference sub-graphs by computing and storing, in the memory, node eccentricities associated with a first sub-graph and a second sub-graph from among the sub-graphs in a first and a second array, respectively; and identify the first sub-graph and the second sub-graph as candidates for being isomorphic and thus belonging to the set of reference sub-graphs when an eccentricity of the first array and an eccentricity of the second array match one another.

In Example 31, the subject matter of one or more of Examples 29-30, wherein the processing means further identify (i) the location of one or more sub-graphs in the netlist that are isomorphic to one of the set of reference sub-graphs by executing a pattern matching process that utilizes, as a pattern matching parameter, a predetermined number of nodes from a start element of the first array and the second array, respectively, and (ii) a location of recurring sub-circuits in the circuit design using matching strings computed as a result of the pattern matching process.

In Example 32, the subject matter of one or more of Examples 29-31 wherein the processing means further partitions the netlist into the decomposed netlist by randomly selecting the subset of the set of sub-graphs having a size that matches one or more of the reference sub-graphs.

In Example 33, the subject matter of one or more of Examples 29-32, wherein the processing means further partitions the netlist into the decomposed netlist such that the center of nodes of the subset of the set of sub-graphs are the same distance from a center of the graph.

In Example 34, the subject matter of one or more of Examples 29-33, wherein the netlist has a flat design in which only primitives are instanced.

In Example 35, the subject matter of one or more of Examples 29-34, wherein at least some of the one or more of the sub-circuits that are associated with the reference sub-graphs have a different netlist granularity.

Example 36 is a non-transitory computer readable medium having instructions stored thereon that, when executed by a processing means, cause the processing means to: receive a graph dataset corresponding to a graph representation of a netlist of a circuit design for which fault injection simulation is to be performed in accordance with an initial fault list, the graph including a set of sub-graphs associated with respective sub-circuits of the circuit design; calculate, from the graph, a set of reference sub-graphs that are candidates for being isomorphic with other sub-graphs in the netlist; partition the netlist into a decomposed netlist by selecting a subset of the set of sub-graphs having a size that matches one or more of the reference sub-graphs; identify, as one or more isomorphic sub-graphs, one or more sub-graphs within the decomposed netlist that are isomorphic with one or more of the reference sub-graphs; identify a location of each of the isomorphic sub-graphs in the netlist; and remove the identified location of all but one of the isomorphic sub-graphs in the netlist from the initial fault list to generate a reduced fault list.

In Example 37, the subject matter of Example 36, further including instructions that, when executed by the processing means, cause the processing means to: calculate the set of reference sub-graphs by computing node eccentricities associated with a first sub-graph and a second sub-graph from among the sub-graphs in a first array and a second array, respectively; and identify the first sub-graph and the second sub-graph as candidates for being isomorphic and thus belonging to the set of reference sub-graphs when an eccentricity of the first array and an eccentricity of the second array match one another.

In Example 38, the subject matter of one or more of Examples 36-37, further including instructions that, when executed by the processing means, cause the processing means to identify (i) the location of one or more sub-graphs in the netlist that are isomorphic to one of the set of reference sub-graphs by executing a pattern matching process that utilizes, as a pattern matching parameter, a predetermined number of nodes from a start element of the first array and the second array, respectively, and (ii) a location of recurring sub-circuits in the circuit design using matching strings computed as a result of the pattern matching process.

In Example 39, the subject matter of one or more of Examples 36-38, further including instructions that, when executed by the processing means, cause the processing means to partition the netlist into the decomposed netlist by randomly selecting the subset of the set of sub-graphs having a size that matches one or more of the reference sub-graphs.

In Example 40, the subject matter of one or more of Examples 36-39, further including instructions that, when executed by the processing means, cause the processing means to partition the netlist into the decomposed netlist such that the center of nodes of the subset of the set of sub-graphs are the same distance from a center of the graph.

In Example 41, the subject matter of one or more of Examples 36-40, wherein the netlist has a flat design in which only primitives are instanced.

In Example 42, the subject matter of one or more of Examples 36-41, wherein at least some of the one or more of the sub-circuits that are associated with the reference sub-graphs have a different netlist granularity.

An apparatus as shown and described.

A method as shown and described.

CONCLUSION

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processing circuitry" or "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processing circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A device, comprising:
a communication interface configured to receive a graph dataset corresponding to a graph representation of a netlist of a circuit design for which fault injection simulation is to be performed in accordance with an initial fault list, the graph representation including a set of sub-graphs associated with respective sub-circuits of the circuit design; and
processor circuitry configured to:
calculate, from the graph dataset, a set of reference sub-graphs that are candidates for being isomorphic with other sub-graphs in the netlist;
partition the netlist into a decomposed netlist by selecting a subset of the set of sub-graphs having a size that matches one or more of the reference sub-graphs;
identify, as one or more isomorphic sub-graphs, one or more sub-graphs within the decomposed netlist that are isomorphic with one or more of the reference sub-graphs;
identify a location of each of the isomorphic sub-graphs in the netlist; and
remove the identified location of all but one of the isomorphic sub-graphs in the netlist from the initial fault list to generate a reduced fault list.

2. The device of claim 1, wherein the processor circuitry is configured to:
calculate the set of reference sub-graphs by computing and storing, in a memory associated with the device, node eccentricities associated with a first sub-graph and a second sub-graph, from among the sub-graphs, in a first and a second array, respectively; and
identify the first sub-graph and the second sub-graph as candidates for being isomorphic and thus belonging to the set of reference sub-graphs when an eccentricity of the first array and an eccentricity of the second array match one another.

3. The device of claim 2, wherein the processor circuitry is configured to identify (i) the location of one or more sub-graphs in the decomposed netlist that are isomorphic to one of the set of reference sub-graphs by executing a pattern matching process that utilizes, as a pattern matching parameter, a predetermined number of nodes from a start element of the first array and the second array, respectively, and (ii) a location of recurring sub-circuits in the circuit design using matching strings computed as a result of the pattern matching process.

4. The device of claim 1, wherein the processor circuitry is configured to partition the netlist into the decomposed netlist by randomly selecting the subset of the set of sub-graphs having a size that matches one or more of the reference sub-graphs.

5. The device of claim 1, wherein the processor circuitry is configured to partition the netlist into the decomposed netlist such that a center of nodes of the subset of the set of sub-graphs are a same distance from a center of the graph representation.

6. The device of claim 1, wherein the netlist has a flat design in which only primitives are instanced.

7. The device of claim 1, wherein a portion of the sub-circuits that are associated with the reference sub-graphs have a different netlist granularity.

8. A device, comprising:
a memory configured to store computer-readable instructions; and
processor circuitry configured to execute the computer-readable instructions stored in the memory to:
receive a graph dataset corresponding to a graph representation of a netlist of a circuit design for which fault injection simulation is to be performed in accordance with an initial fault list, the graph representation including a set of sub-graphs associated with respective sub-circuits of the circuit design;
calculate, from the graph dataset, a set of reference sub-graphs that are candidates for being isomorphic with other sub-graphs in the netlist;
partition the netlist into a decomposed netlist by selecting a subset of the set of sub-graphs having a size that matches one or more of the reference sub-graphs;
identify, as one or more isomorphic sub-graphs, one or more sub-graphs within the decomposed netlist that are isomorphic with one or more of the reference sub-graphs;
identify a location of each of the isomorphic sub-graphs in the netlist; and
remove the identified location of all but one of the isomorphic sub-graphs in the netlist from the initial fault list to generate a reduced fault list.

9. The device of claim 8, wherein the processor circuitry is configured to:
calculate the set of reference sub-graphs by computing and storing, in the memory, node eccentricities associated with a first sub-graph and a second sub-graph, from among the sub-graphs, in a first and a second array, respectively; and
identify the first sub-graph and the second sub-graph as candidates for being isomorphic and thus belonging to the set of reference sub-graphs when an eccentricity of the first array and an eccentricity of the second array match one another.

10. The device of claim 9, wherein the processor circuitry is configured to identify (i) the location of one or more sub-graphs in the decomposed netlist that are isomorphic to one of the set of reference sub-graphs by executing a pattern matching process that utilizes, as a pattern matching parameter, a predetermined number of nodes from a start element of the first array and the second array, respectively, and (ii)

a location of recurring sub-circuits in the circuit design using matching strings computed as a result of the pattern matching process.

11. The device of claim 8, wherein the processor circuitry is configured to partition the netlist into the decomposed netlist by randomly selecting the subset of the set of sub-graphs having a size that matches one or more of the reference sub-graphs.

12. The device of claim 8, wherein the processor circuitry is configured to partition the netlist into the decomposed netlist such that a center of nodes of the subset of the set of sub-graphs are a same distance from a center of the graph representation.

13. The device of claim 8, wherein the netlist has a flat design in which only primitives are instanced.

14. The device of claim 8, wherein a portion of the sub-circuits that are associated with the reference sub-graphs have a different netlist granularity.

15. A non-transitory computer readable medium having instructions stored thereon that, when executed by processor circuitry, cause the processor circuitry to:

receive a graph dataset corresponding to a graph representation of a netlist of a circuit design for which fault injection simulation is to be performed in accordance with an initial fault list, the graph representation including a set of sub-graphs associated with respective sub-circuits of the circuit design;

calculate, from the graph dataset, a set of reference sub-graphs that are candidates for being isomorphic with other sub-graphs in the netlist;

partition the netlist into a decomposed netlist by selecting a subset of the set of sub-graphs having a size that matches one or more of the reference sub-graphs;

identify, as one or more isomorphic sub-graphs, one or more sub-graphs within the decomposed netlist that are isomorphic with one or more of the reference sub-graphs;

identify a location of each of the isomorphic sub-graphs in the netlist; and remove the identified location of all but one of the isomorphic sub-graphs in the netlist from the initial fault list to generate a reduced fault list.

16. The non-transitory computer readable medium of claim 15, further including instructions that, when executed by the processor circuitry, cause the processor circuitry to:

calculate the set of reference sub-graphs by computing node eccentricities associated with a first sub-graph and a second sub-graph, from among the sub-graphs, in a first array and a second array, respectively; and identify the first sub-graph and the second sub-graph as candidates for being isomorphic and thus belonging to the set of reference sub-graphs when an eccentricity of the first array and an eccentricity of the second array match one another.

17. The non-transitory computer readable medium of claim 16, further including instructions that, when executed by the processor circuitry, cause the processor circuitry to identify (i) the location of one or more sub-graphs in the decomposed netlist that are isomorphic to one of the set of reference sub-graphs by executing a pattern matching process that utilizes, as a pattern matching parameter, a predetermined number of nodes from a start element of the first array and the second array, respectively, and (ii) a location of recurring sub-circuits in the circuit design using strings computed as a result of the pattern matching process.

18. The non-transitory computer readable medium of claim 15, further including instructions that, when executed by the processor circuitry, cause the processor circuitry to partition the netlist into the decomposed netlist by randomly selecting the subset of the set of sub-graphs having a size that matches one or more of the reference sub-graphs.

19. The non-transitory computer readable medium of claim 15, further including instructions that, when executed by the processor circuitry, cause the processor circuitry to partition the netlist into the decomposed netlist such that a center of nodes of the subset of the set of sub-graphs are a same distance from a center of the graph representation.

20. The non-transitory computer readable medium of claim 15, wherein the netlist has a flat design in which only primitives are instanced.

21. The non-transitory computer readable medium of claim 15, wherein a portion of the sub-circuits that are associated with the reference sub-graphs have a different netlist granularity.

* * * * *